United States Patent
Lung

(10) Patent No.: US 8,110,430 B2
(45) Date of Patent: Feb. 7, 2012

(54) VACUUM JACKET FOR PHASE CHANGE MEMORY ELEMENT

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/911,554

(22) Filed: Oct. 25, 2010

(65) Prior Publication Data

US 2011/0263075 A1 Oct. 27, 2011

Related U.S. Application Data

(62) Division of application No. 12/199,372, filed on Aug. 27, 2008, now Pat. No. 7,842,536, which is a division of application No. 11/408,802, filed on Apr. 21, 2006, now Pat. No. 7,449,710.

(60) Provisional application No. 60/738,956, filed on Nov. 21, 2005.

(51) Int. Cl.
*H01L 21/00* (2006.01)
(52) U.S. Cl. ............................................ 438/95; 438/98
(58) Field of Classification Search ............. 438/95, 438/98
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg |
| 4,719,594 A | 1/1988 | Young |
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,391,901 A | 2/1995 | Tanabe |
| 5,515,488 A | 5/1996 | Hoppe et al. |
| 5,534,712 A | 7/1996 | Ovshinsky et al. |

(Continued)

FOREIGN PATENT DOCUMENTS

WO 2004025659 A1 3/2004

OTHER PUBLICATIONS

Wolf, Stanley, Excerpt from: Silicon Processing for the VLSI Era—vol. 4, pp. 674-679, 2004.

(Continued)

*Primary Examiner* — Phuc Dang
(74) *Attorney, Agent, or Firm* — Haynes Beffel & Wolfeld LLP

(57) ABSTRACT

A memory device including a phase change element and a vacuum jacket. The device includes a first electrode element; a phase change element in contact with the first electrode element; an upper electrode element in contact with the phase change element; a bit line electrode in contact with the upper electrode element; and a dielectric fill layer surrounding the phase change element and the upper electrode element, spaced from the same and sealed by the bit line electrode to define a vacuum jacket around the phase change element and upper electrode element.

6 Claims, 8 Drawing Sheets

U.S. PATENT DOCUMENTS

| | | | |
|---|---|---|---|
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,840 B2 * | 8/2005 | Sun et al. ................ 257/30 |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |

| | | | | | | |
|---|---|---|---|---|---|---|
| 7,202,493 B2 | 4/2007 | Lung | | 2005/0212024 A1 | 9/2005 | Happ |
| 7,208,751 B2 | 4/2007 | Ooishi | | 2005/0212026 A1 | 9/2005 | Chung et al. |
| 7,214,958 B2 | 5/2007 | Happ | | 2005/0215009 A1 | 9/2005 | Cho |
| 7,220,983 B2 | 5/2007 | Lung | | 2005/0263829 A1 | 12/2005 | Song et al. |
| 7,229,883 B2 | 6/2007 | Wang et al. | | 2006/0006472 A1 | 1/2006 | Jiang |
| 7,238,959 B2 | 7/2007 | Chen | | 2006/0018156 A1 | 1/2006 | Happ |
| 7,238,994 B2 * | 7/2007 | Chen et al. ............... 257/379 | | 2006/0038221 A1 | 2/2006 | Lee et al. |
| 7,248,494 B2 | 7/2007 | Oh et al. | | 2006/0066156 A1 | 3/2006 | Dong et al. |
| 7,251,157 B2 | 7/2007 | Osada et al. | | 2006/0073642 A1 | 4/2006 | Yeh et al. |
| 7,253,429 B2 | 8/2007 | Klersy et al. | | 2006/0091476 A1 | 5/2006 | Pinnow et al. |
| 7,254,059 B2 | 8/2007 | Li et al. | | 2006/0094154 A1 | 5/2006 | Lung |
| 7,262,502 B2 * | 8/2007 | Chang ..................... 257/758 | | 2006/0108667 A1 | 5/2006 | Lung |
| 7,269,052 B2 | 9/2007 | Segal et al. | | 2006/0110878 A1 | 5/2006 | Lung et al. |
| 7,277,317 B2 | 10/2007 | Le Phan | | 2006/0110888 A1 | 5/2006 | Cho et al. |
| 7,291,556 B2 | 11/2007 | Choi et al. | | 2006/0113520 A1 | 6/2006 | Yamamoto et al. |
| 7,309,630 B2 | 12/2007 | Fan et al. | | 2006/0113521 A1 | 6/2006 | Lung |
| 7,314,776 B2 | 1/2008 | Johnson et al. | | 2006/0118913 A1 | 6/2006 | Yi et al. |
| 7,317,201 B2 | 1/2008 | Gutsche et al. | | 2006/0124916 A1 | 6/2006 | Lung |
| 7,321,130 B2 | 1/2008 | Lung et al. | | 2006/0126395 A1 | 6/2006 | Chen et al. |
| 7,323,708 B2 | 1/2008 | Lee et al. | | 2006/0131555 A1 | 6/2006 | Liu et al. |
| 7,323,734 B2 | 1/2008 | Ha et al. | | 2006/0138467 A1 | 6/2006 | Lung |
| 7,332,370 B2 | 2/2008 | Chang et al. | | 2006/0154185 A1 | 7/2006 | Ho et al. |
| 7,336,526 B2 | 2/2008 | Osada et al. | | 2006/0157680 A1 | 7/2006 | Takaura et al. |
| 7,351,648 B2 | 4/2008 | Furukawa et al. | | 2006/0157681 A1 | 7/2006 | Chen et al. |
| 7,359,231 B2 | 4/2008 | Venkataraman et al. | | 2006/0163554 A1 | 7/2006 | Lankhorst et al. |
| 7,364,935 B2 | 4/2008 | Lung | | 2006/0169968 A1 | 8/2006 | Happ |
| 7,365,385 B2 | 4/2008 | Abbott | | 2006/0172067 A1 | 8/2006 | Ovshinsky et al. |
| 7,379,328 B2 | 5/2008 | Osada et al. | | 2006/0175599 A1 | 8/2006 | Happ |
| 7,385,235 B2 | 6/2008 | Lung | | 2006/0192193 A1 | 8/2006 | Lee et al. |
| 7,388,273 B2 | 6/2008 | Burr et al. | | 2006/0198183 A1 | 9/2006 | Kawahara et al. |
| 7,390,691 B2 * | 6/2008 | Dennison et al. ............... 438/95 | | 2006/0202245 A1 | 9/2006 | Zuliani et al. |
| 7,394,088 B2 | 7/2008 | Lung | | 2006/0205108 A1 | 9/2006 | Maimon et al. |
| 7,397,060 B2 | 7/2008 | Lung | | 2006/0211165 A1 | 9/2006 | Hwang et al. |
| 7,400,522 B2 | 7/2008 | Toda et al. | | 2006/0226409 A1 | 10/2006 | Burr et al. |
| 7,423,300 B2 | 9/2008 | Lung et al. | | 2006/0234138 A1 | 10/2006 | Fehlhaber et al. |
| 7,426,134 B2 | 9/2008 | Happ et al. | | 2006/0237756 A1 | 10/2006 | Park et al. |
| 7,440,308 B2 | 10/2008 | Jeong et al. | | 2006/0245236 A1 | 11/2006 | Zaidi |
| 7,449,710 B2 | 11/2008 | Lung | | 2006/0250885 A1 | 11/2006 | Cho et al. |
| 7,473,576 B2 | 1/2009 | Lung | | 2006/0261392 A1 | 11/2006 | Lee et al. |
| 7,479,649 B2 | 1/2009 | Lung | | 2006/0266993 A1 | 11/2006 | Suh et al. |
| 7,485,891 B2 | 2/2009 | Hamann et al. | | 2006/0284157 A1 | 12/2006 | Chen et al. |
| 7,488,968 B2 | 2/2009 | Lee | | 2006/0284158 A1 | 12/2006 | Lung et al. |
| 7,502,252 B2 | 3/2009 | Fuji et al. | | 2006/0284214 A1 | 12/2006 | Chen |
| 7,507,986 B2 | 3/2009 | Lung | | 2006/0284279 A1 | 12/2006 | Lung et al. |
| 7,514,334 B2 | 4/2009 | Chen et al. | | 2006/0286709 A1 | 12/2006 | Lung et al. |
| 7,514,705 B2 | 4/2009 | Breitwisch et al. | | 2006/0286743 A1 | 12/2006 | Lung et al. |
| 7,515,461 B2 | 4/2009 | Happ et al. | | 2006/0289847 A1 | 12/2006 | Dodge |
| 7,569,844 B2 | 8/2009 | Lung | | 2006/0289848 A1 | 12/2006 | Dennison |
| 7,683,360 B2 | 3/2010 | Chen et al. | | 2007/0007613 A1 | 1/2007 | Wang et al. |
| 7,688,619 B2 | 3/2010 | Lung et al. | | 2007/0008786 A1 | 1/2007 | Scheuerlein |
| 7,696,503 B2 | 4/2010 | Lung et al. | | 2007/0030721 A1 | 2/2007 | Segal et al. |
| 7,701,759 B2 | 4/2010 | Lung et al. | | 2007/0037101 A1 | 2/2007 | Morioka |
| 2002/0017701 A1 | 2/2002 | Klersy et al. | | 2007/0040159 A1 | 2/2007 | Wang |
| 2002/0070457 A1 | 6/2002 | Sun et al. | | 2007/0045606 A1 | 3/2007 | Magistretti et al. |
| 2002/0113273 A1 | 8/2002 | Hwang et al. | | 2007/0051936 A1 | 3/2007 | Pellizzer et al. |
| 2002/0168852 A1 | 11/2002 | Harshfield et al. | | 2007/0096162 A1 | 5/2007 | Happ et al. |
| 2003/0072195 A1 | 4/2003 | Mikolajick | | 2007/0096248 A1 | 5/2007 | Philipp et al. |
| 2003/0095426 A1 | 5/2003 | Hush et al. | | 2007/0108077 A1 | 5/2007 | Lung et al. |
| 2003/0116794 A1 | 6/2003 | Lowrey | | 2007/0108429 A1 | 5/2007 | Lung |
| 2003/0186481 A1 | 10/2003 | Lung | | 2007/0108430 A1 | 5/2007 | Lung |
| 2004/0026686 A1 | 2/2004 | Lung | | 2007/0108431 A1 | 5/2007 | Chen et al. |
| 2004/0051094 A1 | 3/2004 | Ooishi | | 2007/0109836 A1 | 5/2007 | Lung |
| 2004/0113137 A1 | 6/2004 | Lowrey | | 2007/0109843 A1 | 5/2007 | Lung et al. |
| 2004/0165422 A1 | 8/2004 | Hideki et al. | | 2007/0111429 A1 | 5/2007 | Lung |
| 2004/0248339 A1 | 12/2004 | Lung | | 2007/0115794 A1 | 5/2007 | Lung |
| 2004/0256610 A1 | 12/2004 | Lung | | 2007/0117315 A1 | 5/2007 | Lai et al. |
| 2005/0018526 A1 | 1/2005 | Lee | | 2007/0120104 A1 | 5/2007 | Ahn et al. |
| 2005/0029502 A1 | 2/2005 | Hudgens | | 2007/0121363 A1 | 5/2007 | Lung |
| 2005/0052904 A1 | 3/2005 | Cho et al. | | 2007/0121374 A1 | 5/2007 | Lung et al. |
| 2005/0062087 A1 | 3/2005 | Chen et al. | | 2007/0126040 A1 | 6/2007 | Lung |
| 2005/0093022 A1 | 5/2005 | Lung | | 2007/0131922 A1 | 6/2007 | Lung |
| 2005/0127347 A1 | 6/2005 | Choi et al. | | 2007/0138458 A1 | 6/2007 | Lung |
| 2005/0127349 A1 | 6/2005 | Horak et al. | | 2007/0147105 A1 | 6/2007 | Lung et al. |
| 2005/0141261 A1 | 6/2005 | Ahn | | 2007/0154847 A1 | 7/2007 | Chen et al. |
| 2005/0145984 A1 | 7/2005 | Chen et al. | | 2007/0155172 A1 | 7/2007 | Lai et al. |
| 2005/0167656 A1 | 8/2005 | Sun et al. | | 2007/0156949 A1 | 7/2007 | Rudelic et al. |
| 2005/0191804 A1 | 9/2005 | Lai et al. | | 2007/0158632 A1 | 7/2007 | Ho |
| 2005/0195633 A1 | 9/2005 | Choi et al. | | 2007/0158633 A1 | 7/2007 | Lai et al. |
| 2005/0201182 A1 | 9/2005 | Osada et al. | | 2007/0158645 A1 | 7/2007 | Lung |

| | | | |
|---|---|---|---|
| 2007/0158690 A1 | 7/2007 | Ho et al. | |
| 2007/0158862 A1 | 7/2007 | Lung | |
| 2007/0161186 A1 | 7/2007 | Ho | |
| 2007/0170881 A1 | 7/2007 | Noh et al. | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0187664 A1 | 8/2007 | Happ | |
| 2007/0201267 A1 | 8/2007 | Happ et al. | |
| 2007/0215852 A1 | 9/2007 | Lung | |
| 2007/0224726 A1 | 9/2007 | Chen et al. | |
| 2007/0235811 A1 | 10/2007 | Furukawa et al. | |
| 2007/0236989 A1 | 10/2007 | Lung | |
| 2007/0246699 A1 | 10/2007 | Lung | |
| 2007/0249090 A1 | 10/2007 | Philipp et al. | |
| 2007/0252127 A1 | 11/2007 | Arnold et al. | |
| 2007/0257300 A1 | 11/2007 | Ho et al. | |
| 2007/0262388 A1 | 11/2007 | Ho et al. | |
| 2007/0267618 A1 | 11/2007 | Zaidi et al. | |
| 2007/0274121 A1 | 11/2007 | Lung et al. | |
| 2007/0285960 A1 | 12/2007 | Lung et al. | |
| 2007/0298535 A1 | 12/2007 | Lung | |
| 2008/0006811 A1 | 1/2008 | Philipp et al. | |
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0106923 A1 | 5/2008 | Lung | |
| 2008/0137400 A1 | 6/2008 | Chen et al. | |
| 2008/0138929 A1 | 6/2008 | Lung | |
| 2008/0138930 A1 | 6/2008 | Lung | |
| 2008/0138931 A1 | 6/2008 | Lung | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2008/0303014 A1 | 12/2008 | Goux et al. | |
| 2008/0310208 A1 | 12/2008 | Daley | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |
| 2009/0072215 A1 | 3/2009 | Lung et al. | |
| 2009/0098678 A1 | 4/2009 | Lung | |
| 2009/0166603 A1 | 7/2009 | Lung | |
| 2009/0268507 A1 | 10/2009 | Breitwisch et al. | |
| 2009/0289242 A1 | 11/2009 | Breitwisch et al. | |
| 2009/0294748 A1 | 12/2009 | Breitwisch et al. | |
| 2010/0055830 A1 | 3/2010 | Chen et al. | |
| 2010/0084624 A1 | 4/2010 | Lung et al. | |
| 2010/0144128 A1 | 6/2010 | Lung et al. | |
| 2010/0151652 A1 | 6/2010 | Lung et al. | |
| 2010/0157665 A1 | 6/2010 | Lung et al. | |
| 2010/0193763 A1 | 8/2010 | Chen et al. | |

OTHER PUBLICATIONS

Wuttig, Matthias, "Towards a Universal Memory?" Nature Materials, Apr. 2005, pp. 265-266, vol. 4.
Yamada, Noboru, "Potential of Ge-Sb-Te phase-change optical disks for high-data-rate recording in the near future," (Conference Proceedings Paper), Jul. 30, 1997, vol. 3109, 10 pages.
Yi, J. H. et al., "Novel Cell Structure of PRAM with Thin Metal Layer Inserted GeSbTe," IEEE IEDM Dec. 10, 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
Rochefort, C. et al., "Manufacturing of High Aspect-Ration p-n Junctions Using Vapor Phase Doping for Application in Multi-Resurf Devices," IEEE Jun. 4-7, 2002, pp. 237-240.
Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.
Strauss, Karl F. et al., "Overview of Radiation Tolerant Unlimited Write Cycle Non-Volatile Memory," IEEE Mar. 18-25, 2000, pp. 399-40.
Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.
Wicker, Guy, "A Comprehensive Model of Submicron Chalcogenide Switching Devices," Doctoral Dissertation, Wayne State University, Detroit, MI 1996, 137 pp.
"Magnetic Bit Boost," www.sciencenews.org, Dec. 18 & 25, 2004, p. 389, vol. 166.
"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published at least as early as Dec. 1997, pp. 1-6.
Bedeschi, F. et al., "4-Mb MOSFET-Selected Phase-Change Memory Experimental Chip," IEEE, Sep. 21-23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

\* cited by examiner

VACUUM JACKET FOR PHASE CHANGE MEMORY ELEMENT

REFERENCE TO RELATED APPLICATION

This application is a Divisional of U.S. patent application Ser. No. 12/199,372 filed 27 Aug. 2008, which issued 30 Nov. 2010 as U.S. Pat. No. 7,842,536, which is a Divisional of U.S. patent application Ser. No. 11/408,802 filed 21 Apr. 2006, which issued 11 Nov. 2008 as U.S. Pat. No. 7,449,710, which application claims the benefit of U.S. Provisional Patent Application No. 60/738,956 filed Nov. 21, 2005, titled "Vacuum Jacket for Phase Change Memory Element". The above-referenced applications are incorporated herein by reference for all purposes.

PARTIES TO A JOINT RESEARCH AGREEMENT

International Business Machines Corporation, a New York corporation; Macronix International Corporation, Ltd., a Taiwan corporation; and Infineon Technologies AG, a German corporation, are parties to a Joint Research Agreement.

BACKGROUND OF THE INVENTION

1. Field of the Invention

The present invention is generally related to the field of non-volatile memory devices, and more particularly to the field of memory devices that employ phase change materials.

2. Description of Related Art

Phase change based memory materials are widely used in read-write optical disks, and such materials are seeing increasing use in computer memory devices. These materials have at least two solid phases, including, for example, a generally amorphous solid phase and a generally crystalline solid phase. Laser pulses are used in read-write optical disks to switch between phases and to read the optical properties of the material after the phase change, and electrical pulses are employed in the same manner in computer memory devices.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000, and Reinberg, "Chalcogenide Memory Cell with a Plurality of Chalcogenide Electrodes," U.S. Pat. No. 5,920,788, issued Jul. 6, 1999.

A specific issue arising from conventional phase change memory and structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

One approach to the heat flow problem is seen in U.S. Pat. No. 6,815,704, entitled "Self Aligned Air-Gap Thermal Insulation for Nano-scale Insulated Chalcogenide Electronics (NICE) RAM", in which an attempt is made to isolate the memory cell. That structure, and the attendant fabrication process, is overly complex, yet it does not promote minimal current flow in the memory device.

It is desirable therefore to provide a memory cell structure having small dimensions and low reset currents, as well as a structure that addresses the heat conductivity problem, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

One aspect of the invention is a memory device including a phase change element and a vacuum jacket. The device includes a first electrode element; a phase change element in contact with the first electrode element; an upper electrode element in contact with the phase change element; a bit line electrode in contact with the upper electrode element; and a dielectric fill layer surrounding the phase change element and the upper electrode element, spaced from the same and sealed by the bit line electrode to define a vacuum jacket around the phase change element and upper electrode element.

DETAILED DESCRIPTION

Figure 1:
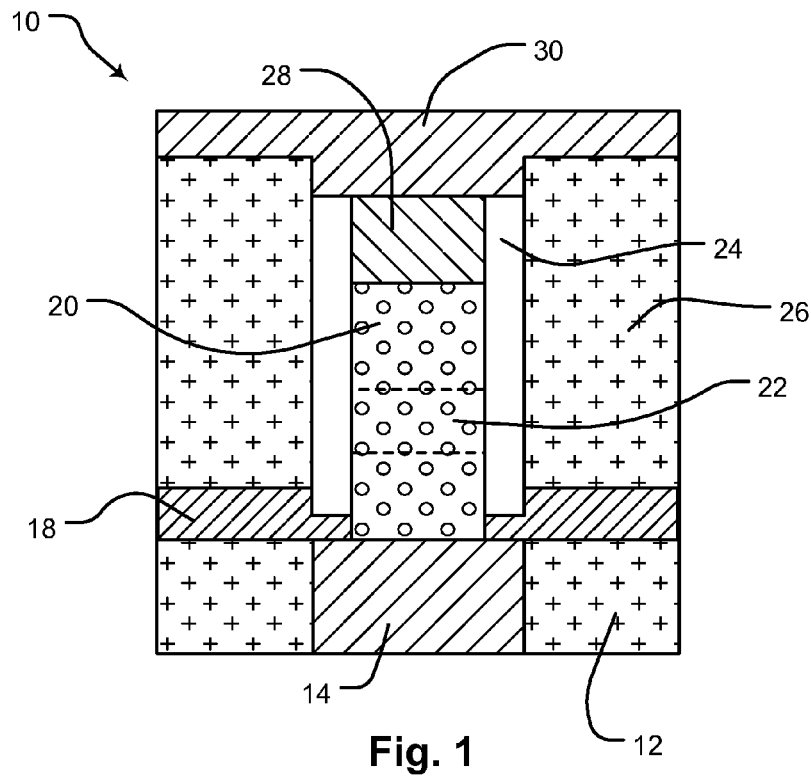
FIG. 1 is a cross-sectional view that illustrates an embodiment of a phase change memory element employing a vacuum jacket.

The following discussion describes embodiments of the invention with particular reference to FIGS. 1-3. It will be understood that the examples and features shown are exemplary and illustrative in nature and not intended to limit the scope of the invention. That scope is defined solely by the claims appended hereto.

The present invention concerns memory elements and memory cells. As used herein, and as is well known in the art, a memory cell is a circuit device designed to hold a charge or state to indicate the logic level of a single data bit. Memory cells are arrayed to provide, for example, the random access memory for a computer. Within certain memory cells, a memory element performs the function of actually holding the charge or state. In a conventional dynamic random access memory cell, for example, a capacitor indicates the logic level of the cell, with a fully charged state indicating a logic 1, or high, state, and fully discharged indicating a logic 0, or low, state.

A memory element 10, an embodiment of the present invention, is illustrated generally in FIG. 1. As seen there, the memory element 10 is shown as a single unit, for purposes of clarity. In practice, each element is a part of a memory cell, which in turn is part of a larger memory array, as discussed more fully below. The structure of a memory element will be discussed first, followed by a description of the process for fabricating the same.

The memory element is formed on a substrate 12, which is preferably a dielectric fill material such as silicon dioxide. Other suitable materials include polyimide, silicon nitride or other dielectric fill materials known in the art. Extending through the substrate to make electrical contact with exterior circuitry (not shown) is a plug element 14, preferably formed from a refractory metal such as tungsten. Other suitable refractory metals include Ti, Mo, Al, Ta, Cu, Pt, Ir, La, Ni, and Ru. The plug element functions as an electrode, and can be referred to as the lower electrode element.

Extending upward from the plug element are a phase change element 20 and an upper electrode element 28. Above the upper electrode element is bit line 30, which in turn is in electrical contact with outside circuitry (not shown).

The phase change element 20 can be formed from a class of materials preferably including chalcogenide based materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse.

The upper electrode element is preferably formed of titanium nitride (TiN) or similar material, such as one or more elements selected from the group consisting of Si, Ti, Al, Ta, N, O, and C. It should be noted that, for purposes of reference only, the direction from the bottom toward the top of the drawings herein is designated "vertical", and the side-to-side direction is "lateral" or "horizontal." Such designations have no effect on the actual physical orientation of a device, either during fabrication or during use. The bit line 30 is preferably formed from aluminum or other conductive material known to the art for use in metallization.

It is preferred that the thickness (that is, the dimension parallel to the long axis of the printed page herein) of the phase change element 20 be from about 30 nm to about 100 nm, and most preferably about 70 nm. The thickness of the upper electrode element 28 should be from about 30 nm to about 120 nm, and most preferably about 100 nm. The width (that is, the dimension parallel to the short axis of the printed page herein) of the upper electrode element 28 should be from about 20 nm to about 100 nm, and most preferably about 50 nm. The width of the vacuum jacket should be from about 5 nm to about 50 nm, and most preferably about 10 nm. Thus, the total width of the phase change element should be from about 30 nm to about 100 nm, and most preferably about 70 nm.

The electrode element and phase change element are surrounded by an upper insulation layer 26, preferably formed of the same or similar material as the substrate 12. Between the two insulation layers is a barrier layer 18, formed of SiN or similar material.

The upper insulation layer makes contact with the bit line and with the barrier layer, but not with the phase change element and upper electrode element. Rather, the upper insulation layer is spaced from those elements, so that portions of the bit line and barrier layer, together with the spaced-apart portions of the upper insulation layer and the phase change and upper electrode elements define a vacuum jacket 24 surrounding the phase change and upper electrode elements. The vacuum jacket is sealed by the bit line electrode, as explained more fully below. Because the vacuum jacket is sealed in a vacuum environment, it maintains a vacuum in its interior.

In operation, current flows through the memory element from plug assembly 14, into the phase change element 20, and out through the upper electrode 28 and to bit line 30. Of course, the current direction could be altered by changes in element geometry, as will be understood by those in the art. In either event, the phase change material is subject to joule heating as current flows, as discussed above, resulting in a temperature rise in the center 22 of the GST material. When the temperature exceeds the level required for phase change, a portion of the phase change material changes state. Temperature is not uniform throughout the phase change element, with changing values of current density producing significant variations. The temperature of the phase change material determines the effect produced, so the current is chosen to produce a temperature sufficient to create the desired result—either an amorphous state or a crystalline state—in the GST material. If it is desired to read the element status, a low current is employed for sensing purposes. The read operation is non-destructive, as the element temperature is kept below the threshold for a phase change.

The vacuum jacket 24 functions to contain heat within the phase change and upper electrode elements, which has several positive effects. First, by preventing the migration of heat away from the phase change and upper electrode elements, this design reduces the total heat required to effect phase changes, which in turn reduces the current required for each SET or RESET operation. At the same time, retaining heat within the phase change and upper electrode elements reduces the heat transferred to the remainder of the memory array, which translates directly into increased lifespan for the device. Given the vast numbers of memory elements within a complete integrated circuit—at least eight billion elements for a 1 GB memory device, for example—it can be appreciated that the effects of such a heat reduction will be significant. Thus, the illustrated design leads to reduced current consumption by the memory element.

Figures 2A, 2B, 2C:
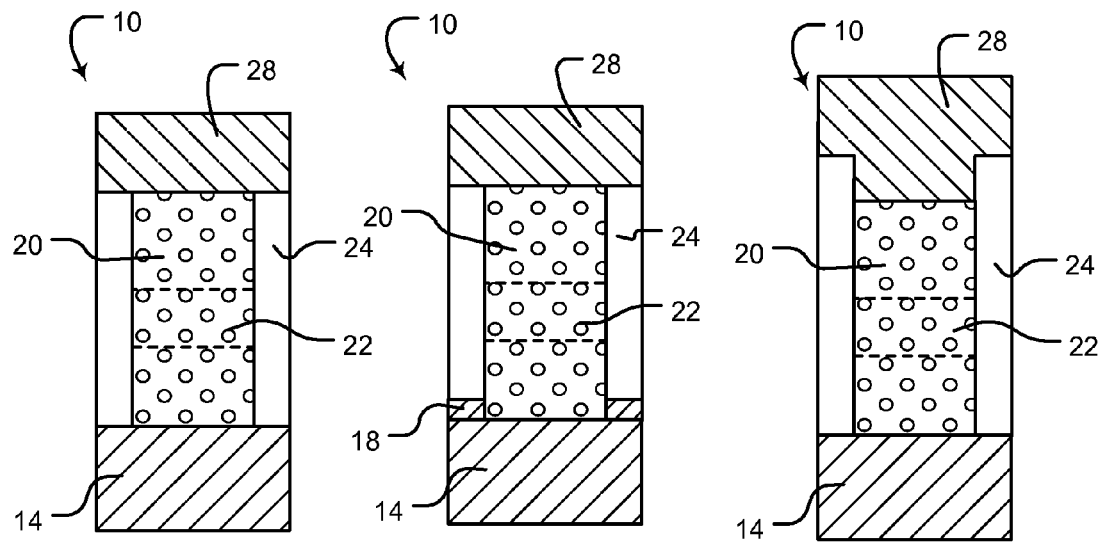
FIGS. 2A-2C illustrate alternate embodiments of a phase change memory element employing an air cell vacuum jacket.

Alternative embodiments of the phase change memory element of the present invention are shown in FIGS. 2A-2C. These embodiments all generally follow the principles set out herein, but the structural details differ in each instance. For example, in FIG. 2A the upper electrode member 28 has a width sufficient to extend across the phase change element 20 and the vacuum jacket 24, sealing the vacuum jacket. Additionally, that embodiment omits the barrier layer altogether. In FIG. 2B, the upper electrode element has the same structure and function as in FIG. 2A, but the barrier layer 18 is included in the design. The embodiment of FIG. 2C is similar to that of FIG. 2B, except that the upper electrode element 28 is generally T-shaped, with its upright portion exposed to the vacuum jacket and the crossbar extending across the vacuum jacket and sealing it. Those in the art will understand that these alternatives are exemplary and illustrate the range of possibilities inherent in the present invention.

Figure 3A:
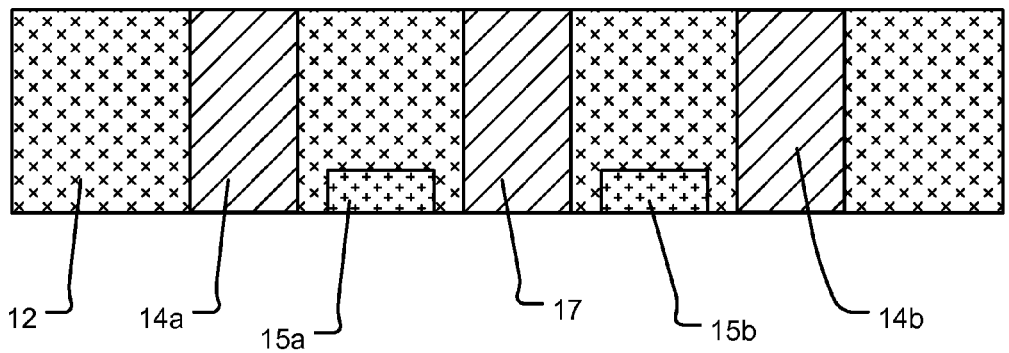
FIGS. 3A-3K illustrate an embodiment of a process for fabricating a phase change memory element as shown in FIG. 1.

An embodiment of a process for fabricating the memory device of the present invention is shown in FIGS. 3A-3K. As known in the art, a memory array is preferably formed employing pairs of memory cells, which structure is shown here. The process begins with a base structure as seen in FIG. 3A, which illustrates a structure suitable for the formation of multiple memory cells, as will be shown below. Plug elements 14a and 14b extend through the substrate material 12, serving separate memory elements. Materials for these two elements are described above. Word lines 15a and 15b extend in a direction perpendicular to the drawing, connecting a number of memory elements in a manner known in the art. It is preferred to form the word lines from polysilicon. Common source line 17 extends through the middle of the pair of memory elements, parallel to the word lines.

Figure 3B:
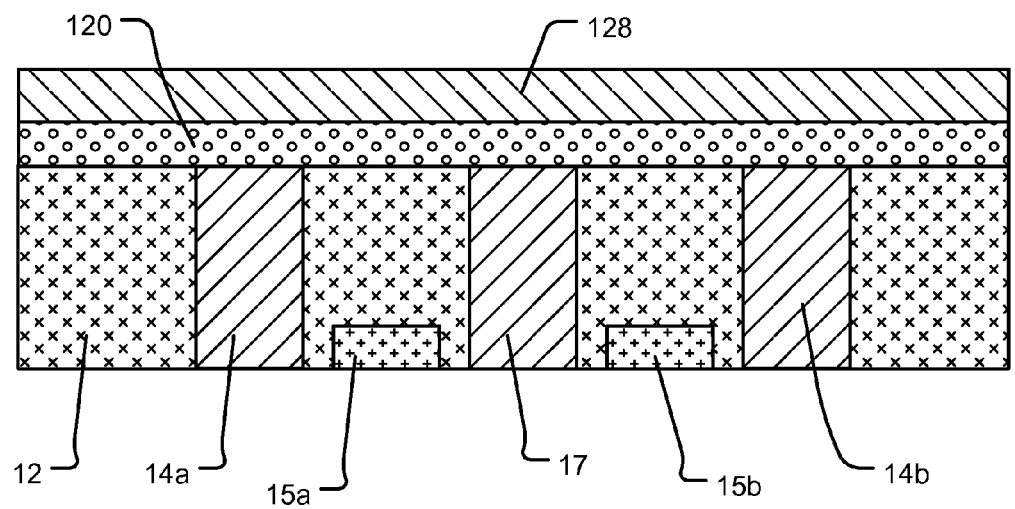
Figure 3C:
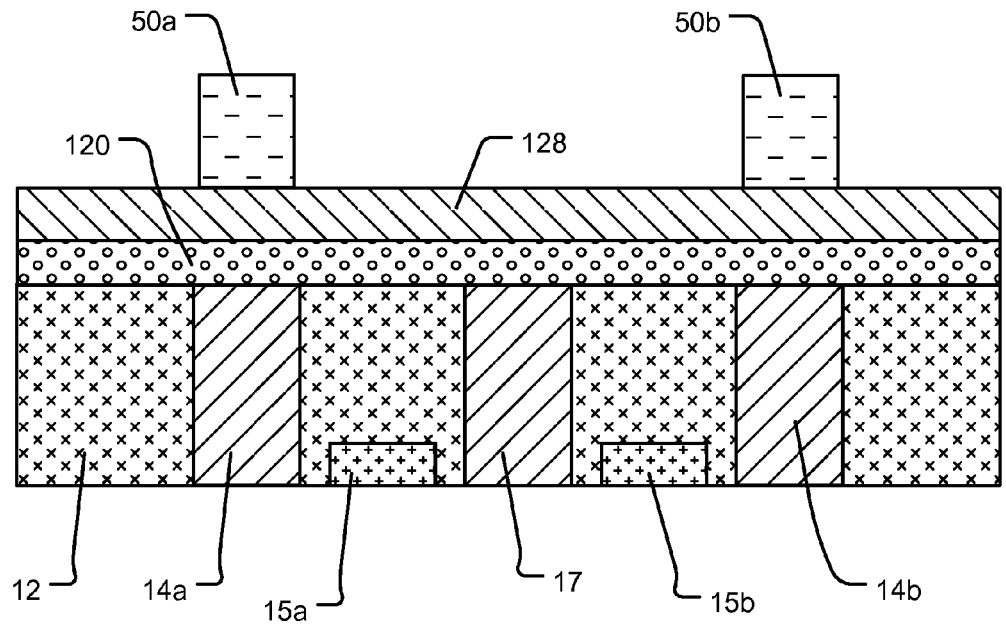
Figure 3D:
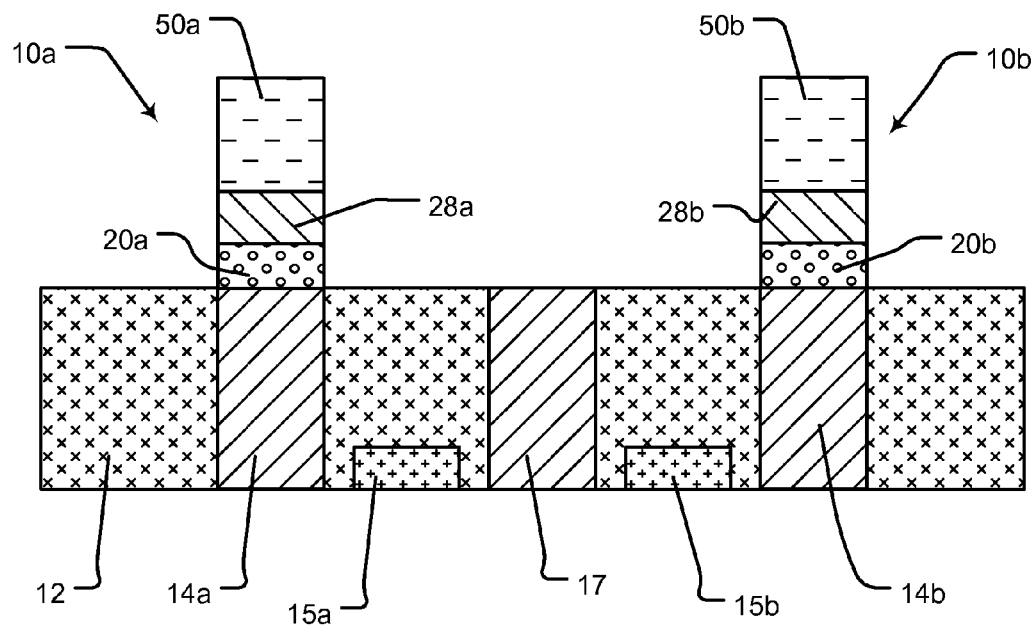
Figure 3E:
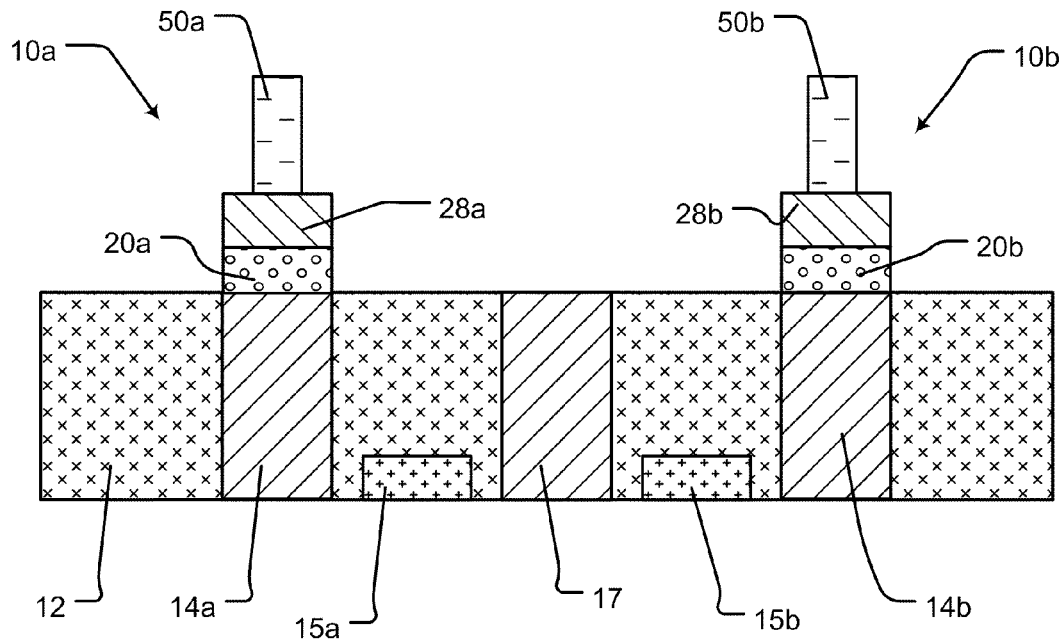

FIG. 3B depicts a two-stage deposition which deposits a layer of GST material 120 atop the dielectric material, followed by a layer of electrode material (preferably TiN) 128. It should be noted that the materials employed in memory element are generally discussed above, and that discussion will not be repeated here. In the succeeding two drawings, FIGS. 3C and 3D, the structure is prepared for an etching operation by first depositing and patterning photoresist material 50a and 50b in desired positions. An etching step follows, with results shown in FIG. 3D, in which two phase change memory elements 10a and 10b are defined. As shown, phase change elements 20a and 20b, together with upper electrode elements 28a and 28b are formed, preferably employing a dry anisotropic etch using a reactive ion etching (RIE), utilizing a chlorine plasma chemistry. An optical emission tool may be used to identify and control the end point of the etch, when the substrate layer is encountered.

Figure 3F:
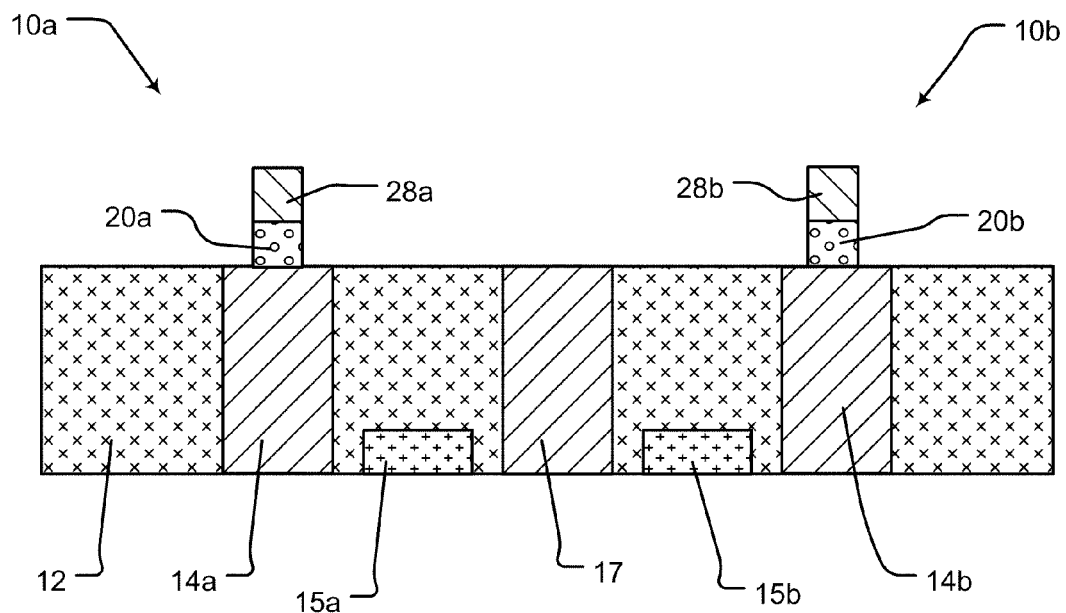

Here, however, conventional lithographic processing is not sufficient to achieve the small dimensions required, in that the required width of the phase change and upper electrode elements is less than the minimum feature size achievable by conventional lithography. Thus, the photoresist is patterned to the smallest possible size in the step shown in FIG. 3C, followed by a trimming step in FIG. 3E to produce the etch masks 50a and 50b having the required size. The process for achieving this result is disclosed in pending patent applications owned by the assignee hereof, such as U.S. patent application Ser. No. 11/338,285, entitled "Self-Aligned Manufacturing Method, and Manufacturing Method For Thin Film Fuse Phase Change Ram", filed Jan. 24, 2006, which document is incorporated by reference herein. The phase change memory elements 10a and 10b are then further etched, and the photoresist stripped, as shown in FIG. 3F.

Figure 3G:
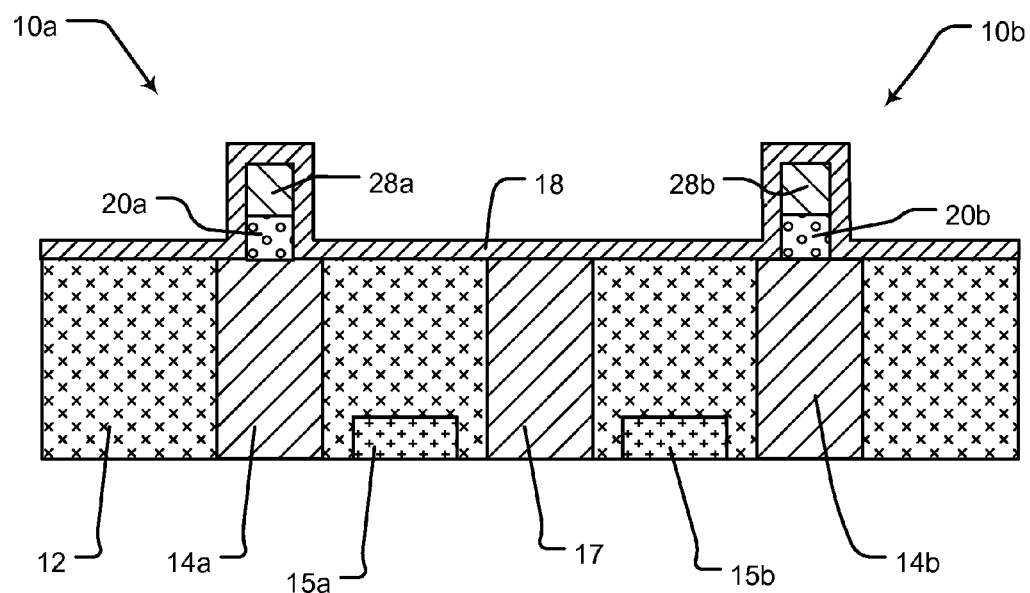
Figure 3H:
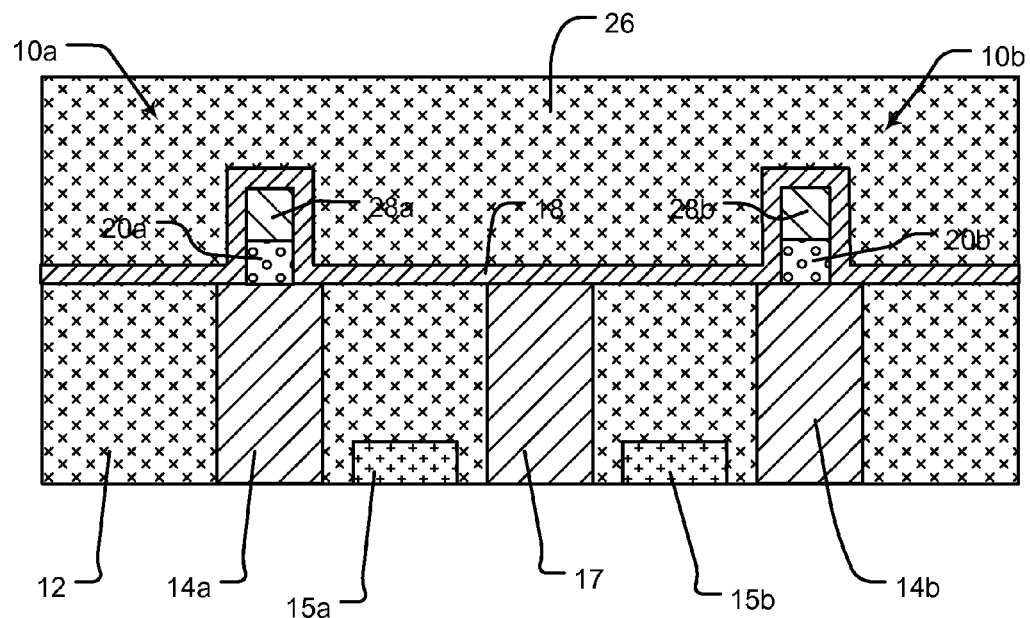
Figure 3I:
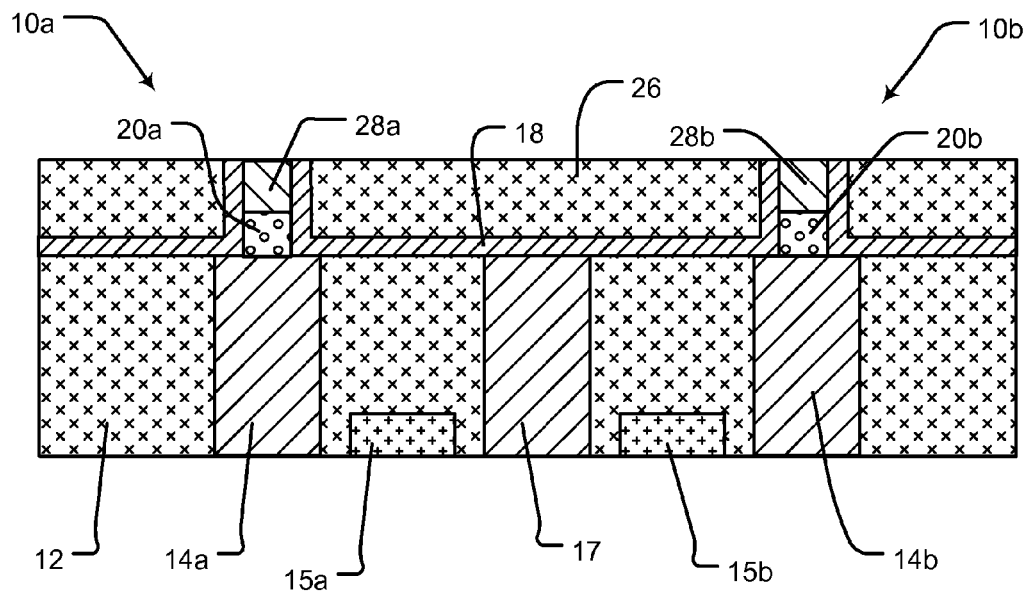

Following the etching, a barrier layer 18 is deposited, composed of SiN, as discussed above. It is preferred to deposit the barrier layer employing the Plasma Enhanced Chemical Vapor Deposition (PECVD) method, producing a generally conformal layer over the substrate and phase change memory elements, as shown in FIG. 3G. That layer is followed by the deposition of an upper insulation layer 26, composed of material the same or similar to that of the substrate 12, as seen in FIG. 3H. That layer is deposited such that it completely covers the phase change memory elements and the barrier layer, as illustrated in FIG. 3H. Then, the upper insulation layer is subjected to planarization, preferably employing chemical-mechanical polishing (CMP) to expose the upper electrode members 28a and 28b, as seen in FIG. 3I.

Figure 3J:
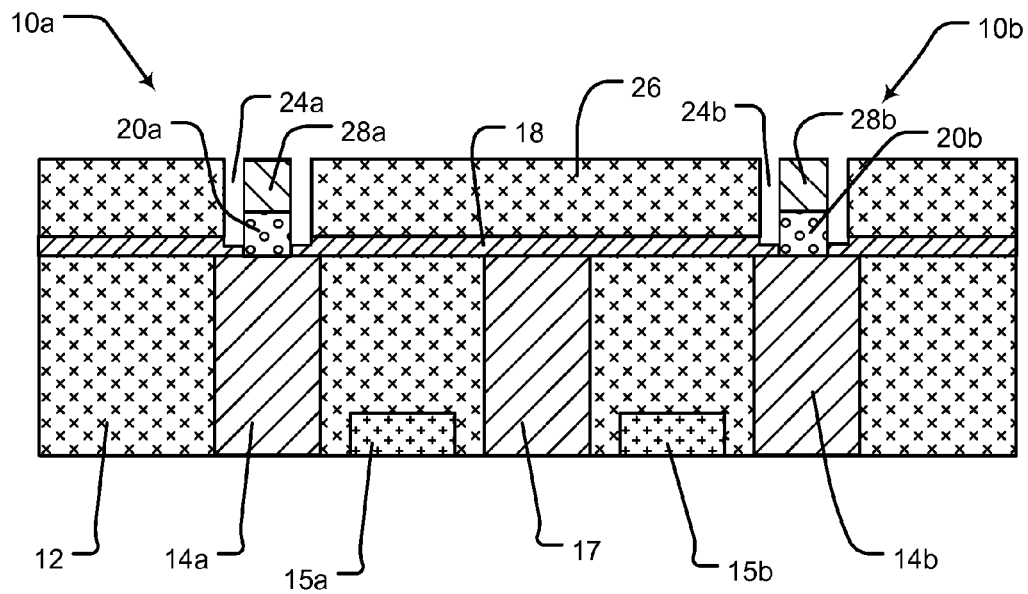
Figure 3J:
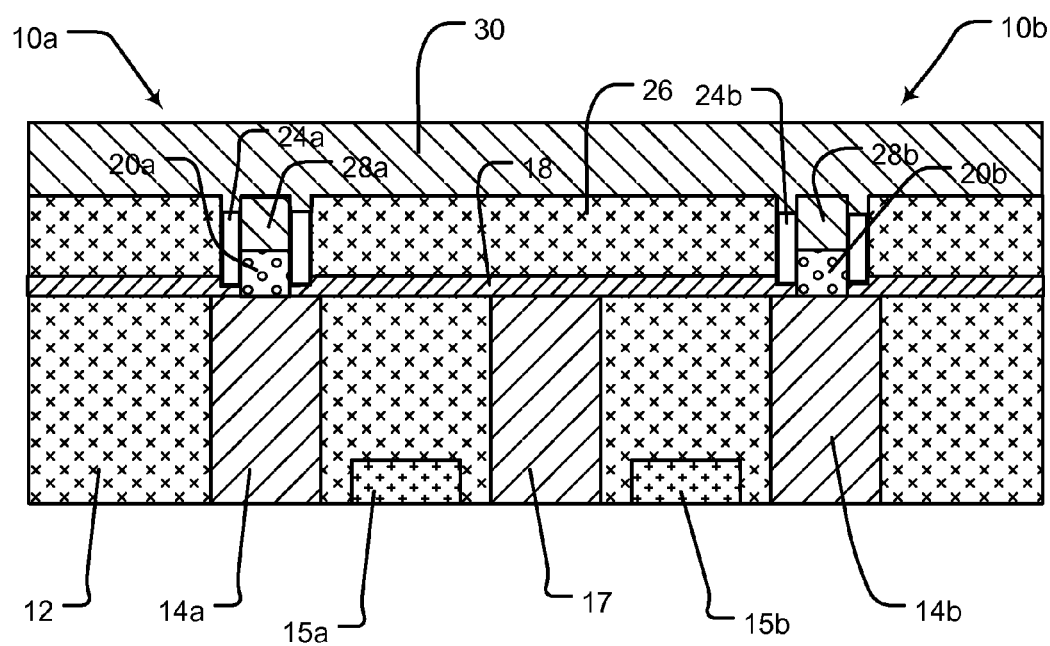

The vacuum jackets are formed in the next two steps. First, the portions of the barrier layer 18 lying next to the phase change and upper electrode elements are etched away, as shown in FIG. 3J. A wet etch, chosen to selectively etch the barrier layer material, is employed for this step. For the preferable material, SiN, a phosphoric acid etch is used. Control is exercised to stop the process before an appreciable etching of either the phase change element, the upper electrode or the dielectric material occurs.

Figure 3K:
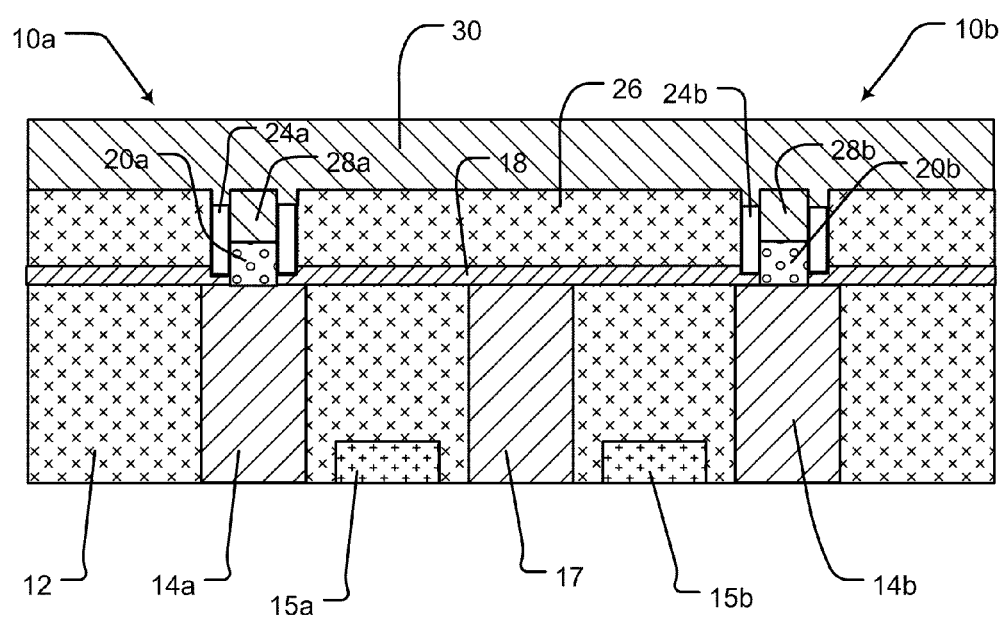

Following the etching step, a metallization step deposits bit line 30 over the entire structure of FIG. 3J, as shown in FIG. 3K. This deposition must suffice to form the vacuum jackets 24a and 24b, by sealing the voids remaining after the previous etching step. The preferred process for this step is sputtering, so that metal material, preferably aluminum, extends into and seals the cell. Process parameters must be chosen such that the sputtering does not altogether fill the cells, as will be understood in the art. Bit line 30 spans memory elements 10a and 10b and extends in both directions to other memory elements, as is known in the art. The fact that this step takes place in a vacuum environment ensures that a vacuum is maintained within the vacuum jacket.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of fabricating a memory device, comprising the steps of:
    forming a memory element and a second electrode on a first electrode;
    depositing a liner layer on the memory element and second electrode;
    forming a dielectric layer surrounding the memory element and second electrode, the upper surface of the dielectric layer being adjusted such that the liner surrounding the second electrode and the upper surface of the second electrode are exposed;
    selectively etching the liner layer to open a void between the memory element and second electrode and the dielectric layer; and
    depositing a bit line electrode element electrically coupled to the second electrode to seal the void, thereby defining a vacuum jacket around the memory element.

2. The method of claim 1, wherein the memory element comprises a combination of Ge, Sb, and Te.

3. The method of claim 1, wherein the memory element comprises a combination of two or more materials from the group of Ge, Sb, Te, Se, In, Ti, Ga, Bi, Sn, Cu, Pd, Pb, Ag, S, and Au.

4. The method of claim 1, wherein the memory element is about 70 nm wide and about 70 nm thick.

5. The method of claim 1, wherein the vacuum jacket is about 10 nm thick.

6. The method of claim 1, wherein the vacuum jacket is around the second electrode.

* * * * *